United States Patent
Kang (10) Patent No.: US 7,205,813 B2
(45) Date of Patent: Apr. 17, 2007

(54) DIFFERENTIAL TYPE DELAY CELLS AND METHODS OF OPERATING THE SAME

(75) Inventor: Dae-Woon Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 11/141,568

(22) Filed: May 31, 2005

(65) Prior Publication Data

US 2005/0264336 A1    Dec. 1, 2005

(30) Foreign Application Priority Data

May 31, 2004    (KR) ...................... 10-2004-0039139

(51) Int. Cl.
*H03H 11/26* (2006.01)
(52) U.S. Cl. ..................... 327/287; 327/288
(58) Field of Classification Search ................ 327/280, 327/281, 284, 285, 287, 288; 331/57, 175, 331/177 R, 177 V, 185
See application file for complete search history.

(56) References Cited

U.S. PATENT DOCUMENTS 5,955,929 A    9/1999    Moon et al. ................... 331/57

6,515,903 B1*   2/2003    Le et al. ................. 365/185.18
2004/0090254 A1*  5/2004   Owens et al. ................ 327/170

FOREIGN PATENT DOCUMENTS

| JP | 2000100163 | 4/2000 |
|---|---|---|
| KR | 100206604 | 4/1999 |
| KR | 990075064 | 10/1999 |
| KR | 1020030068829 | 8/2003 |

OTHER PUBLICATIONS

Notice to Submit a Response for Korean patent application No. 10-2004-0039139 mailed on Oct. 31, 2005.

* cited by examiner

*Primary Examiner*—Linh My Nguyen
(74) *Attorney, Agent, or Firm*—Myers Bigel Sibley & Sajovec, PA (57) ABSTRACT

A differential type delay cell includes a differential amplifier and first and second output capacitor circuits. The differential amplifier is configured to amplify a differential input signal to generate an amplified differential output signal at a pair of output nodes of the delay cell. The first and second output capacitor circuits are respectively coupled to a different one of the output nodes, and are configured to have a variable capacitance that varies in response to variation in a power supply voltage.

17 Claims, 7 Drawing Sheets

DIFFERENTIAL TYPE DELAY CELLS AND METHODS OF OPERATING THE SAME

RELATED APPLICATION

This application claims priority to Korean Patent Application No.10-2004-0039139 filed on May 31, 2004 in the Korean intellectual property Office (KIPO), the entire contents of which are hereby incorporated by reference.

FIELD OF THE INVENTION

The present invention relates generally to a voltage-controlled oscillator for DLL(delayed locked loop) and PLL(phase locked loop), and more particularly, to a differential type delay cell.

BACKGROUND OF THE INVENTION

A voltage controlled oscillator (VCO) is an oscillator which can control the frequency of an output clock in response to a control voltage. CMOS type voltage controlled oscillators are increasingly used because of characteristics that can include a good noise margin and low power consumption.

Two main types of oscillators are LC oscillators, which include LC resonance components, and ring oscillators, which include a chain of delay cells. The ring oscillator is usually suitable for CMOS fabrication processes due to its ease of integration and wide tuning range.

The performance of a ring oscillator generally depends on the operating characteristics of its delay cells. An inverter can be a simplest type of delay cell. For example, an odd number of inverters can be connected serially in a chain to form a ring oscillator. The output clock frequency of a voltage controlled oscillator can be inversely proportional to a delay time of the delay cells. Minimum propagation delay through such inverters creates a limit on the maximum output clock frequency from the ring oscillator, and which may not be sufficient for more recent high speed devices such as in communication devices. Various different types of delay cell have been developed for use in ring oscillators in an attempt to obtain higher output frequency. For example, a differential type delay cell has been developed in which the output signal has a small swing range so as to reduce propagation delay time.

Figure 1:
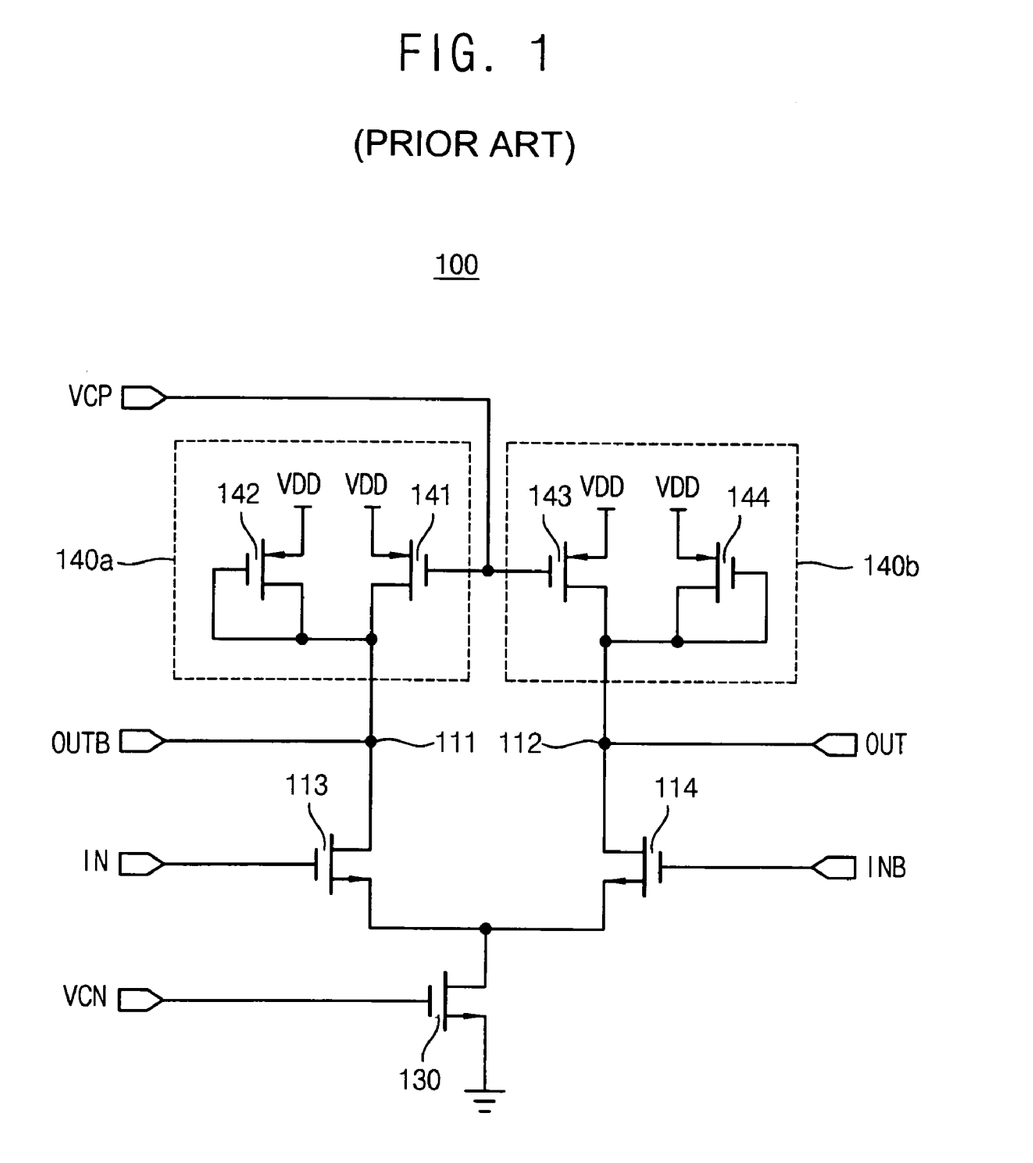
FIG. 1 is a circuit diagram that illustrates a conventional differential type delay cell having a differential input signal and a differential output signal.

FIG. 1 is a circuit diagram that illustrates a conventional differential type delay cell having a differential input signal and a differential output signal.

Referring to FIG. 1, a first input signal IN of the differential input signal and a second input signal INB of the differential input signal are respectively input to gates of a first input transistor 113 and a second input transistor 114. A current source control voltage VCN is applied to a gate of a transistor 130 operating as a current source that controls the amount of current supplied to the first transistor 113 and the second transistor 114.

An output load control voltage VCP applied to output load circuits 140a and 140b controls resistances of output load circuits 140a and 140b so as to adjust a delay time of a first output signal OUTB of the differential output signal and a second output signal OUT of the differential output signal. The output load circuits 140a and 140b can have various configurations.

Figure 2A:
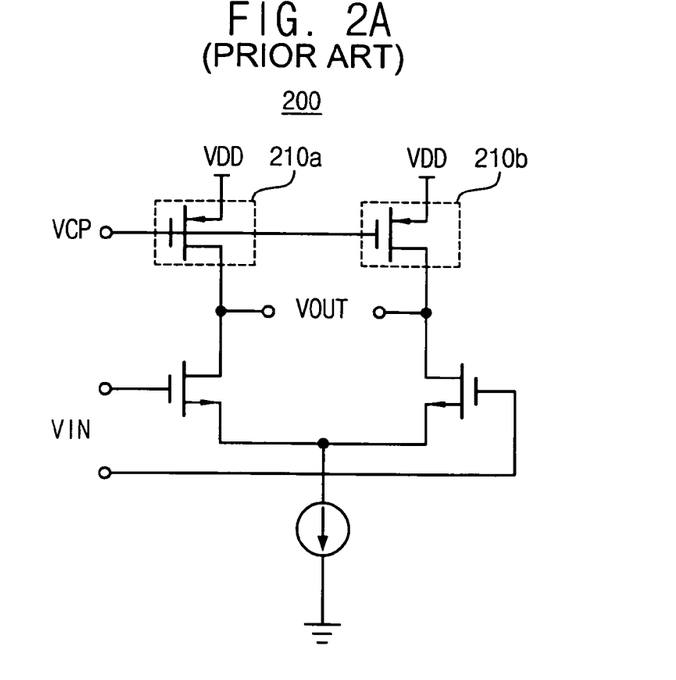
FIG. 2A and FIG. 2B show exemplary conventional delay cells having various different output load circuits.
Figure 2B:
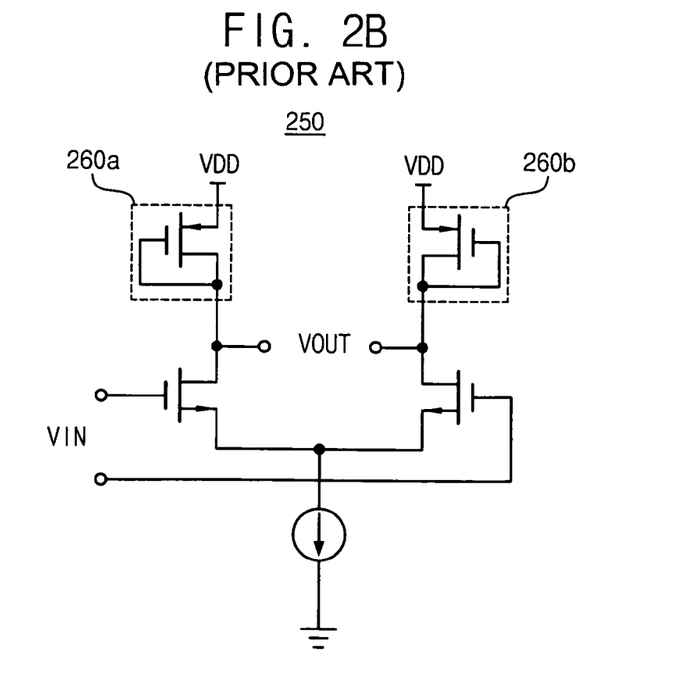

FIG. 2A and FIG. 2B show exemplary delay cells having various types of output load circuits.

Referring to FIG. 2A, delay cell 200 has output load circuits 210a and 210b. Each of the output load circuits 210a and 210b has a transistor gate to which the control voltage VCP is applied in order to control the output load. When the control voltage VCP increases, the resistances of the transistors included in the output load circuits 210a and 210b increase.

Referring to FIG. 2B, delay cell 250 has output load circuits 260a and 260b. Each of the output load circuits 260a and 260b has a diode-connected transistor operating as an output load.

The output load circuit 140a and the output load circuit 140b of the delay cell illustrated in FIG. 1 have a PMOS transistor 141 and 143, respectively, and a diode-connected PMOS transistor 142 and 144, respectively. For the output load circuits 140a, 140b illustrated in FIG. 1, the PMOS transistors 141 and 143 usually operate in a deep-triode region so that the resistances of the PMOS transistors 141 and 143 are linearly proportional to the control voltage VCP. In contrast, the diode connected PMOS transistors 142 and 144 always operate in a saturation region to thereby maintain almost constant resistances.

The delay time of a delay cell is typically proportional to a time constant of the delay cell. The time constants of the delay cell illustrated in FIG. 1 can be represented by the following Equation 1:

$$\tau = (\text{resistance of output load circuit}) \times C_{out} \quad \text{(Equation 1)}$$
$$= (R_{on} \| R_{diode-connected}) \times C_{out}$$
$$= R_{diode-connected} / (1 + R_{diode-connected} / R_{on}) \times C_{out}$$
$$= R_{diode-connected} / (1 + R_{diode-connected}$$
$$k(V_{DD} - V_{CP} - |V_{THP}|)) \times C_{out}$$

$C_{out}$ in Equation 1 represents a total capacitance seen from the first output signal (OUTB) generation point 111 or from the second output signal (OUT) generation point 112 to ground. A total resistance of the output load circuits 140a or 140b is equal to a resistance of a parallel combination (show in Equation 1 as "∥") of transistor 141 and the diode connected transistor 142 or the transistor 143 and the diode connected transistor 144. The symbol "$R_{on}$" represents the resistance of the transistor 141 or 143, and "$R_{diode-connected}$" represents the resistance of the diode connected transistor 142 or 144. The symbol "k" represents a device constant of the transistor 141 or 143.

As described above, when the resistance of the diode connected transistor is maintained constant, the total resistance of the output load circuit 140a or 140b and a power supply voltage VDD are then related such that when the power supply voltage VDD increases, the total resistance of the output load circuit decreases, and when the power voltage VDD decreases, the total resistance of the output load circuit increases. As a result, the time constant τ of the delay cell varies with variation of the power supply voltage VDD that is applied to the delay cell.

As also described above, a delay time $T_D$ of the delay cell is inversely proportional to an output clock frequency of a ring oscillator, and can be proportional to the time constant τ in Equation 1. Consequently, the output clock frequency of a ring oscillator can be inversely proportional to the time constant τ of its delay cell(s), and which may be represented by the following Equation 2.

$$f_{osc} \propto 1/T_D \qquad \text{(Equation 2)}$$

$$\propto 1/\tau,$$

where "$f_{osc}$" is the output clock frequency of the ring oscillator and "$T_D$" is the delay time of the delay cell(s).

It has become common for single chip to include a large number of transistors and to include a voltage-controlled oscillator on the chip using a CMOS fabrication process. The high speed on-off switching operations of the many transistors can introduce noise into the on-chip power supply voltage. Such noise in the power supply voltage can cause instability in the time constant τ of an on-chip delay cell, such as one that operates in accordance with Equation 1, and can result in instability in the output clock frequency of a ring oscillator, such as one that operates in accordance with the Equation 2.

Generating a stable delay time from a delay cell can be very important to the generation of a stable clock signal from a ring oscillator. Instability in the delay time of a delay cell, such as due to power supply voltage noise, may cause clock jitter which can result in erroneous operation in high speed communication systems and/or memory systems.

SUMMARY OF THE INVENTION

In some embodiments of the present invention, a differential type delay cell includes a differential amplifier and first and second output capacitor circuits. The differential amplifier is configured to amplify a differential input signal to generate an amplified differential output signal at a pair of output nodes of the delay cell. The first and second output capacitor circuits are respectively coupled to different ones of the output nodes, and are configured to have a variable capacitance that varies in response to variation in a power supply voltage.

In some further embodiments, the first and second output capacitor circuits are each configured to vary their capacitance to vary a time delay from receipt of the differential input signal at the differential amplifier to generation of the amplified differential output signal at the pair of output nodes.

In some further embodiments, the differential amplifier includes first and second output load circuits that are respectively coupled between the power supply voltage and a different one of the output nodes, and are configured to have a variable resistance in response to an output load control voltage. The first and second output load circuits may each include at least one MOS transistor with a control electrode. The control electrode of the MOS transistor of each of the first and second output load circuits can be responsive to the output load control voltage. The MOS transistor may further include a source electrode and a drain electrode, where one of the source and drain electrodes is coupled to the power supply voltage and the other one of the source and drain electrodes is coupled to one of the output nodes.

In some further embodiments, the first and second output capacitor circuits each include at least one MOS capacitor. They may also include a bias voltage generator that is configured to generate a bias voltage for biasing the at least one MOS capacitor. The MOS capacitor of each of the first and second output capacitor circuits can include a plurality of electrodes, where one of the electrodes is coupled to the bias voltage and another one of the electrodes is coupled to one of the output nodes. The bias voltage generator can be configured to generate the bias voltage to bias the MOS capacitor of each of the first and second output capacitor circuits near a threshold voltage of the MOS capacitors.

The bias voltage generator can include a voltage controlled current source and a load element. The voltage controlled current source can be configured to generate a variable current that varies responsive to a control voltage. The load element and the voltage controlled current source can be coupled in series between the power supply voltage and ground. The bias voltage can be generated from a node between the voltage controlled current source and the load element.

The voltage controlled current source can include at least one MOS transistor with a control electrode coupled to the control voltage, and can be configured to generate the variable current of the voltage controlled current source responsive to the control voltage.

In some further embodiments, the first and second output load circuits can each include at least one diode-connected MOS transistor coupled to the power supply voltage.

In some other embodiments, a method of operating a differential type delay cell includes amplifying a differential input signal to generate an amplified differential output signal at a pair of output nodes of the delay cell, and controlling capacitance at the output nodes in response to variation of a power supply voltage.

In some further embodiments, the capacitance at the output nodes is controlled in response to variation of a power supply voltage by varying a time delay from receipt of the differential input signal to generation of the amplified differential output signal at the pair of output nodes.

In some further embodiments, resistance between the output node to ground is controlled in response to a control voltage to vary a time delay from receipt of the differential input signal to generation of the amplified differential output signal at the pair of output nodes.

In some further embodiments, the capacitance at the output nodes can be controlled in response to variation of a power supply voltage by increasing capacitance at the output nodes in response to increase of the control voltage, and decreasing capacitance at the output nodes in response to decrease of the control voltage.

In some further embodiments, the capacitance at the output nodes can be controlled in response to variation of a power supply voltage by increasing capacitance at the output nodes in response to increase of the power supply voltage, and decreasing capacitance at the output nodes in response to decrease of the power supply voltage.

Accordingly, the delay cell may compensate for variation in the power supply voltage to provide increased stability of a time delay from receipt of a differential input signal thereto to generation of an amplified differential output signal at output nodes thereof. Such time delay stability may allow the delay cell to be used in a ring oscillator to generate a timing signal having increased stability at high frequencies, and which may be suitable for use in high speed memory systems and/or communication systems.

DESCRIPTION OF EMBODIMENTS OF THE INVENTION

Detailed illustrative embodiments of the present invention are disclosed herein. However, specific structural and functional details disclosed herein are merely representative for purposes of describing exemplary embodiments of the present invention. This invention may, however, be embodied in many alternate forms and should not be construed as limited to the embodiments set forth herein.

Accordingly, it should be understood that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

The terminology used herein is for the purpose of describing particular embodiments only and is not intended to be limiting of the invention. As used herein, the term "and/or" includes any and all combinations of one or more of the associated listed items. The singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element or layer is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

It will be understood that although the terms first and second are used herein to describe various elements, these elements should not be limited by these terms. These terms are only used to distinguish element from another element. Thus, a first element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
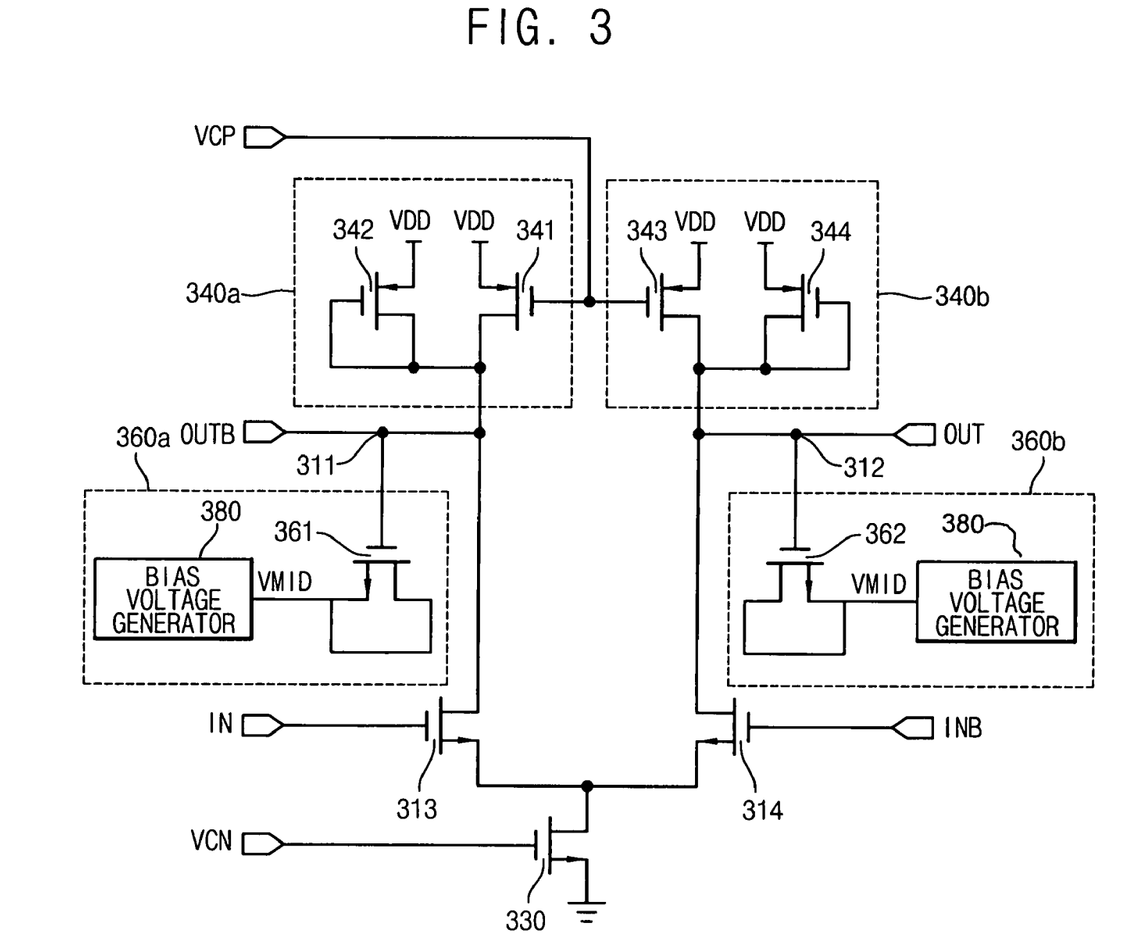
FIG. 3 is a circuit diagram illustrating a delay cell according to some embodiments of the present invention.

FIG. 3 is a circuit diagram illustrating a differential type delay cell according to some embodiments of the present invention.

Referring to FIG. 3, a first input signal IN and a second input signal INB are respectively input to gates of a first input transistor 313 and a second input transistor 314. A current source control voltage VCN is applied to a gate of a transistor 330 that operates as a current source that supplies current to the first transistor 313 and the second transistor 314.

An output load control voltage VCP applied to output load circuits 340a and 340b controls the resistances of the output load circuits 340a and 340b and, thereby, adjusts the delay time of a first output signal OUTB and a second output signal OUT. The output load circuits 340a and 340b can be configured the same as the output load circuits 140A and 140B shown in FIG. 1. Accordingly, output load circuit 340a can include a parallel combination of a PMOS transistor 341 and a diode-connected PMOS transistor 342, and output load circuit 340b can include a parallel combination of a PMOS transistor 343 and a diode-connected PMOS transistor 344. Similar to the configuration of the output load circuits 140a and 140b shown in FIG. 1, the PMOS transistors 341 and 343 can normally operate in a deep-triode region so that the resistances of the PMOS transistors 341 and 343 are linearly proportional to the control voltage VCP. The diode-connected PMOS transistors 342 and 344 can operate in a saturation region such that their resistances are about constant.

The output load circuits 340a, 340b and the first and second transistors 313, 314 are referred to herein as a differential amplifier. The differential amplifier is configured to amplify the differential input signals IN, INB to generate the output signals OUT, OUTB.

In contrast to the delay cell 100 shown in FIG. 1, the delay cell of FIG. 3 includes output capacitor circuits 360a and 360b. The output capacitor circuits 360a and 360b are coupled to output signal generation nodes 311 and 312. Node 311 is coupled to a common node between the input transistor 313 and the output load circuit 340a. Node 312 is coupled to a common node between the input transistor 314 and the output load circuit 340b. The output capacitor circuits 360a and 360b can each include at least one MOS capacitor. For example, as shown in FIG. 3 the output capacitor circuit 360a includes a MOS capacitor 361, and the output capacitor circuit 360b includes a MOS capacitor 362. Source electrodes and drain electrodes of the MOS capacitors 361 and 362 are biased by a bias voltage VMID from a bias voltage generator 380, and output signals OUTB and OUT are respectively applied to a gate of the MOS capacitors 361 and 362. The output capacitor circuits 360a and 360b are configured to compensate for variation of the time constant τ of the delay cell of FIG. 3 due to noise in the power supply voltage by varying their capacitances, $C_{out}$, and, thereby, the capacitance between the output signals OUTB and OUT to ground. A relationship between the capacitance $C_{out}$ of the output capacitor circuits 360a and 360b to the time constant of the delay cell can be represented by the above Equation 1.

Figure 4:
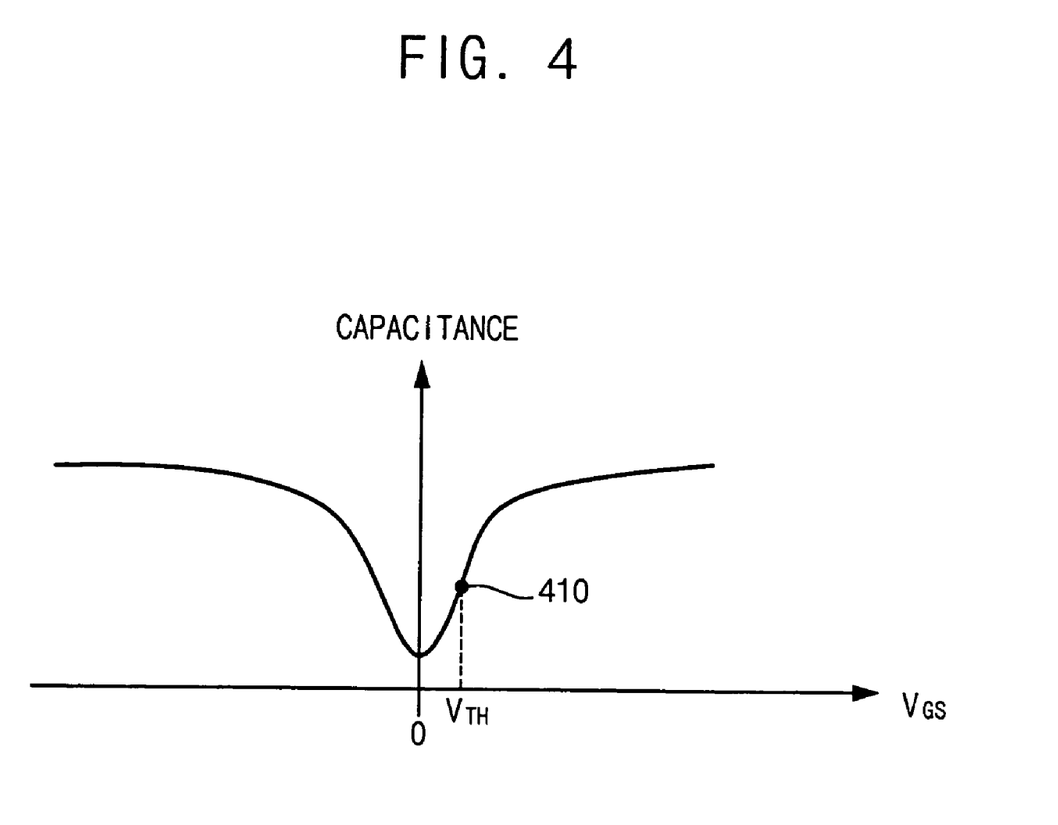
FIG. 4 is a graph illustrating a general characteristic of a MOS capacitor.

FIG. 4 is a graph that illustrates characteristics of a MOS capacitor. Referring to FIG. 4, the horizontal axis represents a difference between a gate voltage and a source voltage of the MOS capacitor, and the vertical axis represents a capacitance of the MOS capacitor. As shown in FIG. 4, increasing gate-source voltage $V_{GS}$ causes an increase in the capacitance of the MOS capacitor. More particularly, in a region that is adjacent to a point 410, which corresponds to a threshold voltage $V_{TH}$ of the MOS capacitor, the gate-source voltage $V_{GS}$ and the capacitance of the MOS capacitor show linear proportionality. Variation in the time constant of the delay cell that is due to the noise in the power supply voltage may be compensated by causing the gate-source voltage $V_{GS}$ to swing in the region near the threshold voltage $V_{TH}$ of the MOS capacitor.

Figure 5:
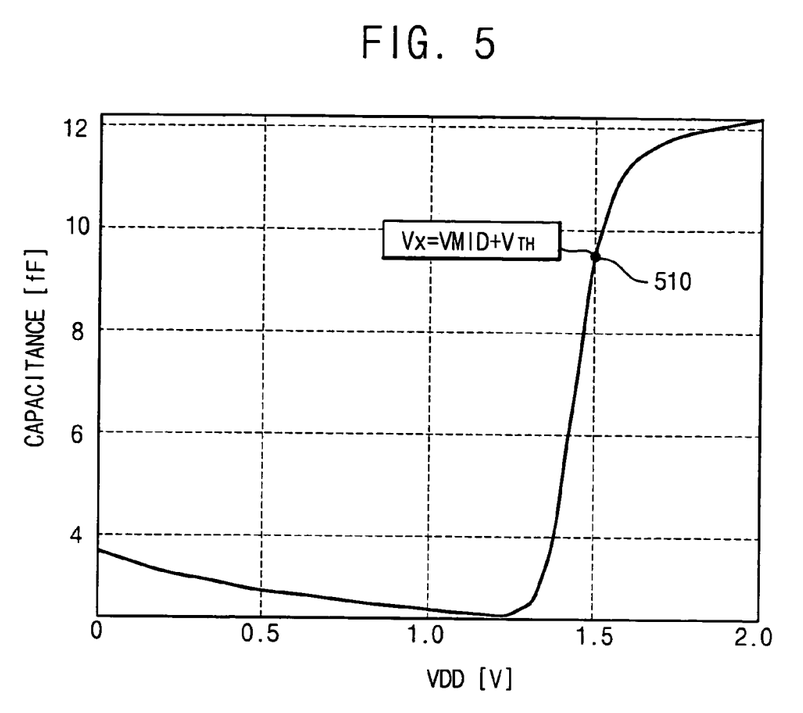
FIG. 5 is a graph illustrating relationship between a power voltage and a capacitance of a MOS capacitor according to some embodiments of the present invention.

FIG. 5 is a graph that illustrates a relationship between a power supply voltage and a capacitance of a MOS capacitor that is configured according to some embodiments of the present invention.

Referring to FIG. 5, the horizontal axis represents a power supply voltage VDD and the vertical axis represents the capacitance of the MOS capacitors 361 and 362 shown in FIG. 3. Output signals $V_X$, which correspond to the common mode output signals OUT and OUTB, are respectively applied to the gates of the MOS capacitors 361 and 362, and the bias voltage VMID is applied to the source electrodes of the MOS capacitors 361 and 362. As described with regard to FIG. 4, it can be desirable to adjust the bias voltage VMID to bias the source electrodes of the MOS capacitors 361 and 362 so that the gate to source voltage $V_X$-VMID of the MOS capacitors 361 and 362 swings (varies) in a region that is near the threshold voltage $V_{TH}$ of the MOS capacitors 361 and 362.

When the power supply voltage VDD increases, the voltage of the output signals OUT and OUTB can increase and the gate to source voltage of the MOS capacitors 361 and 362 can correspondingly increase. The increased gate to source voltage of the MOS capacitors 361 and 362 can also cause increased capacitance of the MOS capacitors 361 and 362. Referring to Equation 1, the increase of the power supply voltage can cause a decrease in the resistance of the output load circuits 340a and 340b and a related decrease in the time constant of the delay cell. However, increased power supply voltage can simultaneously cause an increase in the capacitances of the output capacitor circuits 360a and 360b which can compensate for the variation in the time constant of the delay cell due to the variation in the power supply voltage.

Figure 6:
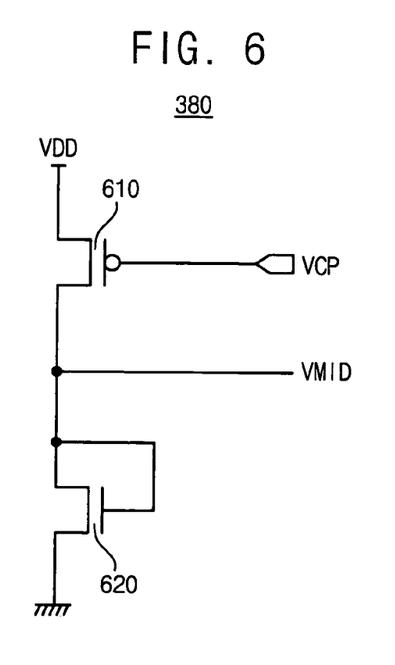
FIG. 6 is a circuit diagram illustrating a bias voltage generator for output capacitors according to some embodiments of the present invention.

FIG. 6 is a circuit diagram that illustrates a bias voltage generator 380, such as that shown in FIG. 3, for use with output capacitors in accordance with some embodiments of the present invention.

The bias voltage generator 380 can be configured to output a constant voltage signal near $V_{TH}$. The bias voltage generator 380 that is shown in FIG. 6 is configured to generate a voltage signal that varies responsive to variation of the power supply voltage $V_{DD}$, which may provide more compensation for the effect of the variation of power supply voltage $V_{DD}$ on the time constant of the delay cell. The bias control voltage generator 380 is configured to cause the source voltage of the MOS capacitors to vary responsive to variation in the power supply voltage $V_{DD}$ so that the MOS capacitors 361 and 362 can operate in a linear region where there is essentially linear proportionality between their gate to source voltage and their capacitance.

With continued reference to FIG. 6, the bias voltage generator 380 includes a PMOS transistor 610 and a diode-connected NMOS transistor 620. A turn-on strength of the PMOS transistor 610 is controlled by a control voltage VCP that is applied to the gate of the PMOS transistor 610. By controlling the control voltage VCP, the bias voltage VMID varies responsive to an amount of current flowing through the diode-connected NMOS transistor 620. For example, when the control voltage VCP increases and the bias voltage VMID decreases, which increases the capacitances of the output capacitor circuits 360a and 360b as the gate to source voltage $V_{GS}$ of the MOS capacitors 361 and 362 increases. In contrast, when the control voltage VCP decreases, the bias voltage VMID increases and causes a decrease of the capacitances of the output capacitor circuits 360a and 360b as the gate to source voltage $V_{GS}$ of the MOS capacitors 361 and 362 decreases. In this manner, the bias control voltage generator 380 can use the control voltage VCP to adjust the delay time of the delay cell.

In addition, when the voltage of output signals OUT and OUTB increases responsive to increased power supply voltage $V_{DD}$, the bias control voltage generator 380 responds by increasing the bias voltage VMID so as to maintain approximate linear operation of the MOS capacitors 361 and 362 near the threshold voltage $V_{TH}$. In contrast, when the voltage of the output signals OUT and OUTB decreases responsive to decreased power supply voltage $V_{DD}$, the bias control voltage generator 380 responds by decreasing the bias voltage VMID so as to maintain approximate linear operation of the MOS capacitors 361 and 362.

Although the exemplary embodiment of the bias voltage generator circuit that is shown in FIG. 6 is a voltage generator circuit that includes a PMOS transistor 610 as a VCCS (Voltage Controlled Current Source) and a diode-connected NMOS transistor 620 as a load element, it is to be understood the other embodiments of the present invention are not limited thereto. Indeed, for example, various other types of VCCS and/or load elements can be used in a bias voltage generator in accordance with some other embodiments of the present invention. For example, in some embodiments the load element can include at least one resistor element having a constant resistance. Moreover, a NMOS transistor can be used in place of the illustrated PMOS transistor 610 in the VCCS, but with the position of VCCS and the load element reversed.

Figure 7A:
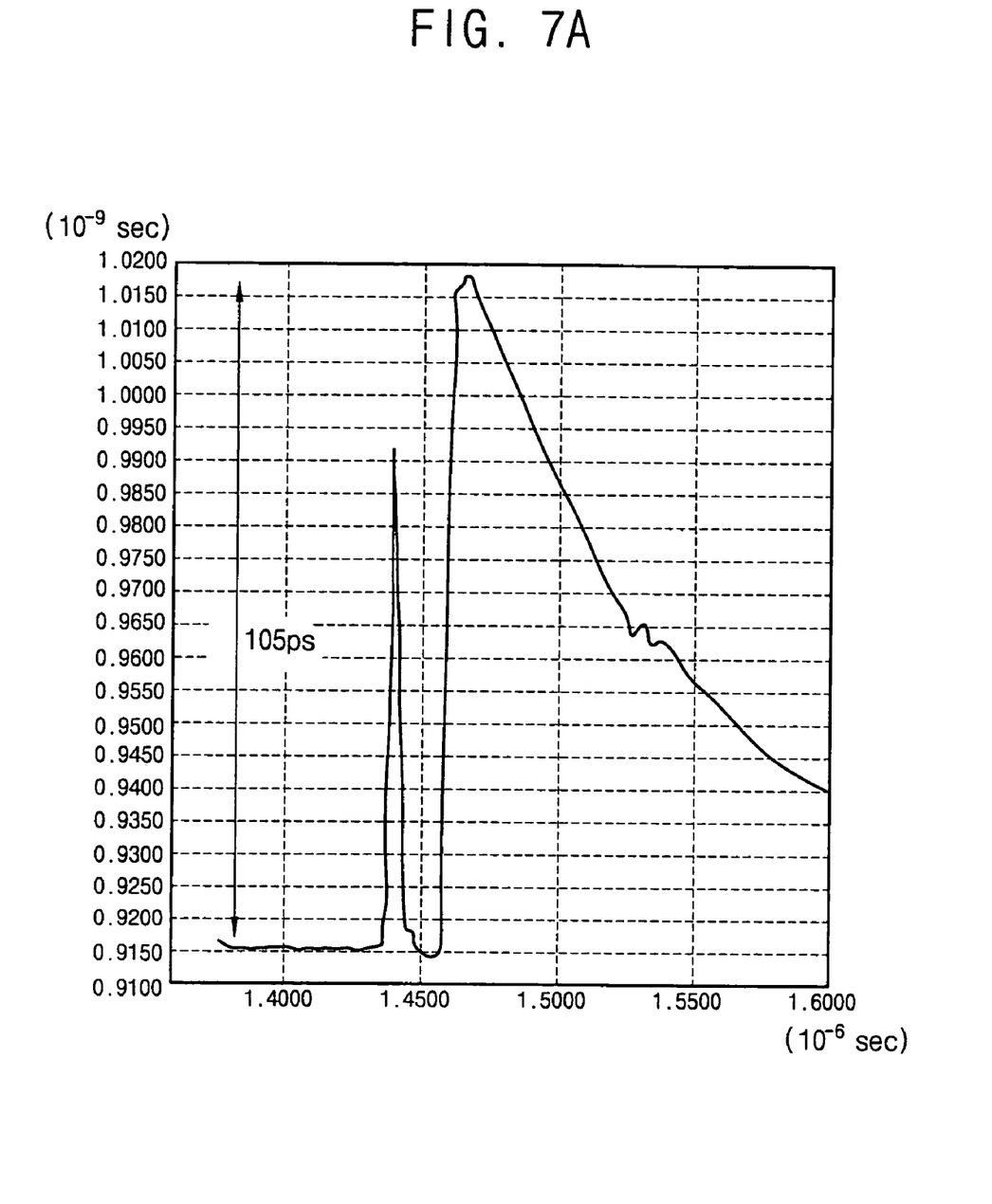
FIG. 7A illustrates jitter characteristics of a clock signal that may be generated by a ring oscillator that includes some conventional delay cells.
Figure 7B:
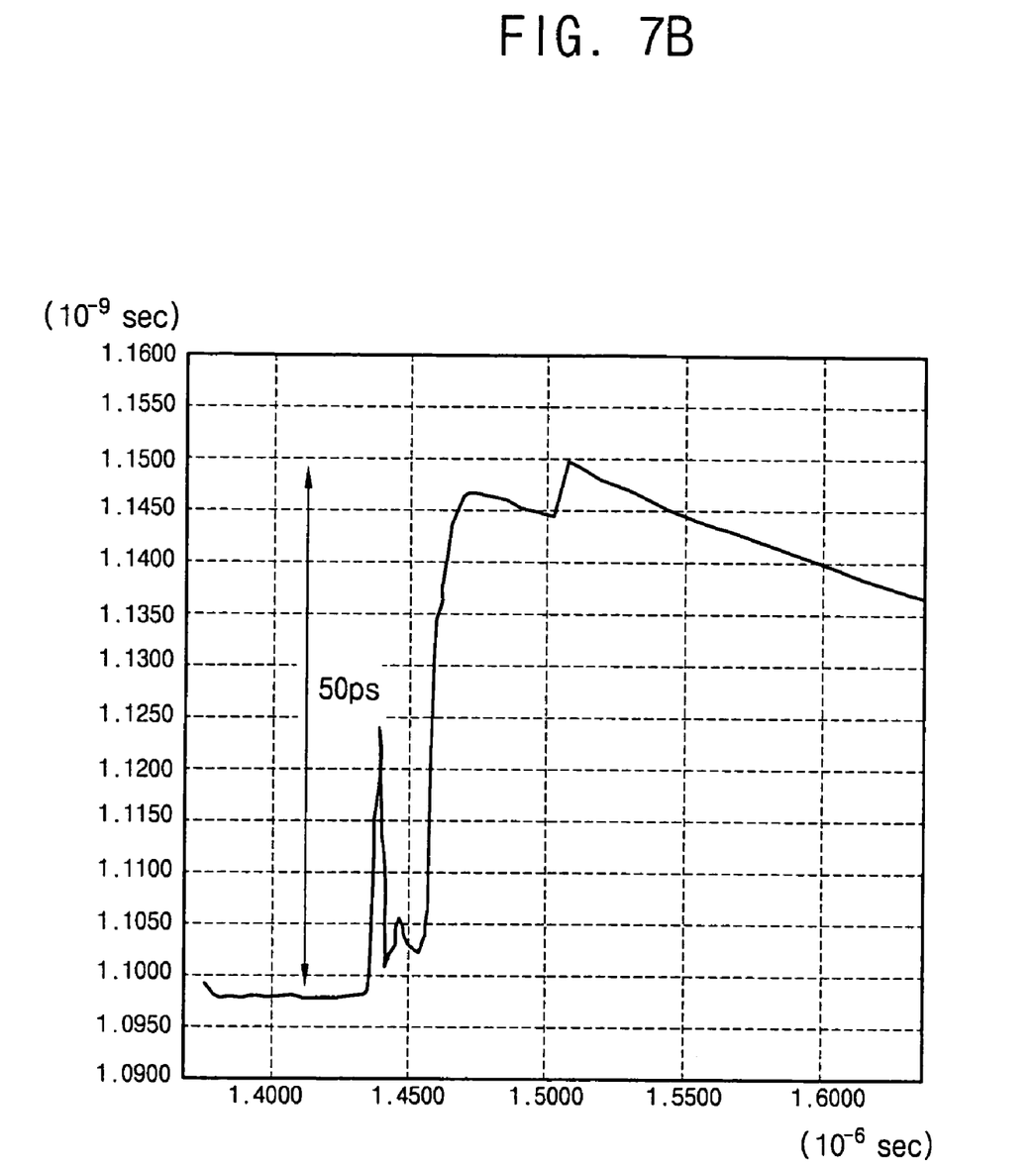
FIG. 7B illustrates jitter characteristics of a clock signal that may be generated by a ring oscillator that includes delay cells that are configured in accordance with some embodiments of the present invention.

FIG. 7A shows jitter characteristics of a clock signal that may be generated by a ring oscillator using conventional delay cells. FIG. 7B shows jitter characteristics of a clock signal that may be generated by a ring oscillator that includes delay cells in accordance with some embodiments of the present invention.

The horizontal axes shown in FIG. 7A and FIG. 7B represent time in micro seconds, and the vertical axes represent jitter of the clock signal measured in nano seconds. Power supply voltage variation (noise) was simulated at 1.8±0.072 Volts with a fluctuation in the power supply voltage of about ±8% variance in nano seconds.

Referring to FIG. 7A, jitter of about 105 pico seconds may be measured for the ring oscillator that includes some conventional delay cells. Referring to FIG. 7B, jitter of about 50 pico seconds may be measured for a ring oscillator that includes delay cells that are in accordance with some embodiments of the present invention. Accordingly, there may be 50% less jitter in the clock signal from a ring oscillator that is configured in accordance with some embodiments of the present invention.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. A differential type delay cell comprising:
a differential amplifier that is configured to amplify a differential input signal to generate an amplified differential output signal at a pair of output nodes of the delay cell; and
first and second output capacitor circuits that are respectively coupled to different ones of the output nodes, and are configured to have a variable capacitance that varies in response to variation in a power supply voltage, and wherein:
the first and second output capacitor circuits each include at least one MOS capacitor;
the first and second output capacitor circuits further comprise a bias voltage generator that is configured to generate a bias voltage for biasing the at least one MOS capacitor;
the MOS capacitor of each of the first and second output capacitor circuits comprises a plurality of electrodes, one of the electrodes is coupled to the bias voltage and another one of the electrodes is coupled to one of the output nodes; and
the bias voltage generator is configured to generate the bias voltage to bias the MOS capacitor of each of the first and second output capacitor circuits near a threshold voltage of the MOS capacitors, and the bias voltage generator comprises: a voltage controlled current source configured to generate a variable current that varies responsive to a control voltage; and a load element, wherein the load element and the voltage controlled current source are coupled in series between the power supply voltage and ground, and wherein the bias voltage is generated from a node between the voltage controlled current source and the load element.

2. The differential type delay cell of claim 1, wherein:
the first and second output capacitor circuits are each configured to vary their capacitance to vary a time delay from receipt of the differential input signal at the differential amplifier to generation of the amplified differential output signal at the pair of output nodes.

3. The differential type delay cell of claim 1, wherein:
the differential amplifier comprises first and second output load circuits that are respectively coupled between the power supply voltage and a different one of the output nodes, and are configured to have a variable resistance in response to an output load control voltage.

4. The differential type delay cell of claim 3, wherein:
the first and second output load circuits each comprise at least one MOS transistor with a control electrode; and
the control electrode of the MOS transistor of each of the first and second output load circuits is responsive to the output load control voltage.

5. The differential type delay cell of claim 4, wherein:
the MOS transistor further comprises a source electrode and a drain electrode; and
one of the source and drain electrodes is coupled to the power supply voltage and the other one of the source and drain electrodes is coupled to one of the output nodes.

6. A differential type delay cell comprising:
a differential amplifier that is configured to amplify a differential input signal to generate an amplified differential output signal at a pair of output nodes of the delay cell; and
first and second output capacitor circuits that are respectively coupled to different ones of the output nodes, and are configured to have a variable capacitance that varies in response to variation in a power supply voltage, and wherein:
the first and second output capacitor circuits each include at least one MOS capacitor;
the first and second output capacitor circuits further comprise a bias voltage generator that is configured to generate a bias voltage for biasing the at least one MOS capacitor;
the MOS capacitor of each of the first and second output capacitor circuits comprises a plurality of electrodes, one of the electrodes is coupled to the bias voltage and another one of the electrodes is coupled to one of the output nodes; and
the bias voltage generator is configured to generate the bias voltage to bias the MOS capacitor of each of the first and second output capacitor circuits near a threshold voltage of the MOS capacitors.

7. The differential type delay cell of claim 1, wherein:
the voltage controlled current source comprises at least one MOS transistor with a control electrode;
the control electrode of the MOS transistor is coupled to the control voltage; and
the MOS transistor is configured to generate the variable current of the voltage controlled current source responsive to the control voltage.

8. The differential type delay cell of claim 3, wherein the first and second output load circuits each comprise at least one diode-connected MOS transistor coupled to the power supply voltage.

9. A method of operating a differential type delay cell comprising:
amplifying a differential input signal to generate an amplified differential output signal at a pair of output nodes of the delay cell; and
controlling capacitance at the output nodes, using first and second output capacitor circuits, in response to variation of a power supply voltage, and wherein:
the first and second output capacitor circuits each include at least one MOS capacitor;
the first and second output capacitor circuits further comprise a bias voltage generator that is configured to generate a bias voltage for biasing the at least one MOS capacitor; and
the MOS capacitor of each of the first and second output capacitor circuits comprises a plurality of electrodes, one of the electrodes is coupled to the bias voltage and another one of the electrodes is coupled to one of the output nodes; and
the method further comprises generating the bias voltage from the bias voltage generator to bias the MOS capacitor of each of the first and second output capacitor circuits near a threshold voltage of the MOS capacitors, wherein the bias voltage generator comprises: a voltage controlled current source configured to generate a variable current that varies responsive to a control voltage; and a load element, wherein the load element and the voltage controlled current source are coupled in series between the power supply voltage and ground, and wherein the bias voltage is generated from a node between the voltage controlled current source and the load element.

10. The method of claim 9, wherein controlling capacitance at the output nodes in response to variation of a power supply voltage comprises varying a time delay from receipt of the differential input signal to generation of the amplified differential output signal at the pair of output nodes.

11. The method of claim 9, further comprising controlling resistance between the output node to a power supply voltage in response to a control voltage to vary a time delay from receipt of the differential input signal to generation of the amplified differential output signal at the pair of output nodes.

12. The method of claim 11, wherein controlling capacitance at the output nodes in response to variation of a power supply voltage further comprises:
increasing capacitance at the output nodes in response to increase of the control voltage; and
decreasing capacitance at the output nodes in response to decrease of the control voltage.

13. The method of claim 9, wherein controlling capacitance at the output nodes in response to variation of a power supply voltage further comprises:
increasing capacitance at the output nodes in response to increase of the power supply voltage; and
decreasing capacitance at the output nodes in response to decrease of the power supply voltage.

14. The differential type delay cell of claim 6, wherein:
the first and second output capacitor circuits are each configured to vary their capacitance to vary a time delay from receipt of the differential input signal at the differential amplifier to generation of the amplified differential output signal at the pair of output nodes.

15. The differential type delay cell of claim 6, wherein:
the differential amplifier comprises first and second output load circuits that are respectively coupled between the power supply voltage and a different one of the output nodes, and are configured to have a variable resistance in response to an output load control voltage.

16. The differential type delay cell of claim 15, wherein:
the first and second output load circuits each comprise at least one MOS transistor with a control electrode; and
the control electrode of the MOS transistor of each of the first and second output load circuits is responsive to the output load control voltage.

17. A method of operating a differential type delay cell comprising:
amplifying a differential input signal to generate an amplified differential output signal at a pair of output nodes of the delay cell; and
controlling capacitance at the output nodes, using first and second output capacitor circuits, in response to variation of a power supply voltage, and wherein:
the first and second output capacitor circuits each include at least one MOS capacitor;
the first and second output capacitor circuits further comprise a bias voltage generator that is configured to generate a bias voltage for biasing the at least one MOS capacitor; and
the MOS capacitor of each of the first and second output capacitor circuits comprises a plurality of electrodes, one of the electrodes is coupled to the bias voltage and another one of the electrodes is coupled to one of the output nodes; and
the method further comprises generating the bias voltage from the bias voltage generator to bias the MOS capacitor of each of the first and second output capacitor circuits near a threshold voltage of the MOS capacitors.

* * * * *